(12) United States Patent
Patwari et al.

(10) Patent No.: US 9,910,937 B2
(45) Date of Patent: Mar. 6, 2018

(54) METHOD AND DEVICE FOR GENERATING DATA REPRESENTING STRUCTURE OF ROOM

(71) Applicant: SAMSUNG ELECTRONICS CO., LTD., Suwon-si (KR)

(72) Inventors: Ayush Patwari, Bangalore (IN); Gaurav Mishra, Bangalore (IN); Rupika Srivastava, Bangalore (IN); Aloknath De, Bangalore (IN); Deepraj Patkar, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 14/725,106

(22) Filed: May 29, 2015

(65) Prior Publication Data
US 2015/0347638 A1    Dec. 3, 2015

(30) Foreign Application Priority Data

May 29, 2014    (IN) ............................ 2640/CHE/2014
May 1, 2015     (KR) ........................ 10-2015-0062277

(51) Int. Cl.
*G06G 7/48* (2006.01)
*G06F 17/50* (2006.01)
(Continued)

(52) U.S. Cl.
CPC .......... *G06F 17/5004* (2013.01); *G01S 7/527* (2013.01); *G01S 15/025* (2013.01);
(Continued)

(58) Field of Classification Search
CPC ........ G01C 15/00; G01C 15/002; A62B 3/00; H05B 37/0227; H05B 37/0245;
(Continued)

(56) References Cited

U.S. PATENT DOCUMENTS 5,091,869 A     2/1992 Ingram et al.
6,759,954 B1 *  7/2004 Myron ............... H05B 37/0227
                                                315/294

(Continued)

FOREIGN PATENT DOCUMENTS

EP    2 045 620 A1    4/2009
EP    2 410 769 A1    1/2012

(Continued)

OTHER PUBLICATIONS

Patrick Lazik et al.; "Indoor Pseudo-ranging of Mobile Devices using Ultrasonic Chirps"; SenSys'12; Nov. 6-9, 2012; 14 pages total.

(Continued)

*Primary Examiner* — Kandasamy Thangavelu
(74) *Attorney, Agent, or Firm* — Sughrue Mion, PLLC

(57) ABSTRACT

A method of generating data representing a structure of a room on a device, the method including: outputting an audio signal at a first position in the room; acquiring a first reflection signal of the audio signal at the first position; outputting the audio signal at a second position in the room; acquiring a second reflection signal of the audio signal at the second position; estimating distance information about the room by using the acquired first and second reflection signals; acquiring at least one angle information about the room; and generating a floor plan illustrating the structure of the room using the estimated distance information and the acquired angle information.

25 Claims, 13 Drawing Sheets

(51) Int. Cl.
*G06F 3/16* (2006.01)
*G01S 15/89* (2006.01)
*G01S 15/02* (2006.01)
*G01S 7/527* (2006.01)
*G01S 15/10* (2006.01)
*G01S 15/46* (2006.01)

(52) U.S. Cl.
CPC .............. *G01S 15/10* (2013.01); *G01S 15/46* (2013.01); *G01S 15/89* (2013.01); *G06F 3/165* (2013.01); *G01S 2015/465* (2013.01)

(58) Field of Classification Search
CPC ...... G06F 17/5004; G06F 3/165; G01S 15/89; G01S 15/025; G01S 7/527; G01S 15/10; G01S 15/46; G01S 2015/465
See application file for complete search history.

(56) References Cited

U.S. PATENT DOCUMENTS

| | | |
|---|---|---|
| 7,334,470 B1 | 2/2008 | Bartoli et al. |
| 7,729,204 B2 | 6/2010 | Peng et al. |
| 8,593,908 B2 | 11/2013 | Ferreira et al. |
| 8,705,893 B1 | 4/2014 | Zhang et al. |
| 2002/0072881 A1* | 6/2002 | Saitta ................ A62B 3/00 703/1 |
| 2003/0176986 A1* | 9/2003 | Dietsch ............ G01C 15/002 702/150 |
| 2005/0275626 A1* | 12/2005 | Mueller ........... H05B 37/0245 345/156 |
| 2012/0169530 A1* | 7/2012 | Padmanabhan ........ G01C 15/00 342/146 |
| 2013/0314688 A1 | 11/2013 | Likholyot |

FOREIGN PATENT DOCUMENTS

| | | |
|---|---|---|
| WO | 2004/097350 A2 | 11/2004 |
| WO | 2011/145030 A1 | 11/2011 |

OTHER PUBLICATIONS

"Acoustic Ruler Pro Application"; Samsung R & D Institute India-Bangalore PVT. LTD.; pp. 1-21.

Search Report and Written Opinion dated Aug. 26, 2015, issued by the International Searching Authority in counterpart International Application No. PCT/KR2015/005246 (PCT/ISA/220, PCT/ISA/210 & PCT/ISA/237).

\* cited by examiner

US 9,910,937 B2

METHOD AND DEVICE FOR GENERATING DATA REPRESENTING STRUCTURE OF ROOM

CROSS-REFERENCE TO RELATED APPLICATIONS

This application claims priority from Indian Patent Application No. 2640/CHE/2014, filed on May 29, 2014, in the Indian Patent Office and Korean Patent Application No. 10-2015-0062277, filed on May 1, 2015, in the Korean Intellectual Property Office, the disclosures of which are incorporated herein by reference in their entireties.

BACKGROUND

1. Field

Apparatuses and methods consistent with one or more exemplary embodiments relate to methods and devices for generating data representing a room structure.

2. Description of the Related Art

With the development of electronic and communication technologies, portable devices using navigation services have been made available. A user uses a navigation service provided via a portable device. However, navigation services may not be provided inside of a building. If information about an internal structure of a building is available, such as a floor plan, a navigation service may be provided inside of the building by using the information about the internal structure of the building. However, if no information about the internal structure of a building is available, a user may not use the navigation service within the building.

Thus, much research has been conducted to provide methods of determining an internal structure of a building using a portable device. However, most methods developed use a device with a special function. Therefore, there is a need for a method of determining an internal structure of a building using a generic portable device.

SUMMARY

One or more exemplary embodiments include methods and devices for generating data representing a room structure.

One or more exemplary embodiments include non-transitory computer-readable recording media having embodied thereon programs for executing the methods of generating data representing a room structure.

Additional aspects will be set forth in part in the description which follows and, in part, will be apparent from the description, or may be learned by practice of the one or more exemplary embodiments.

According to an aspect of one or more exemplary embodiments, there is provided a method of generating data representing a structure of a room on a device including: outputting an audio signal at a first position in the room; acquiring a first reflection signal of the audio signal at the first position; outputting the audio signal at a second position in the room; acquiring a second reflection signal of the audio signal at the second position; estimating distance information about the room by using the acquired first and second reflection signals; acquiring at least one angle information about the room; and generating a floor plan illustrating the structure of the room using the estimated distance information and the acquired angle information.

The method may further include generating a three-dimensional (3D) model illustrating the structure of the room based on the generated floor plan.

The method may further include generating a three-dimensional (3D) model illustrating the structure of the room based on the generated floor plan and information about objects in the room.

The distance information about the room may indicate a distance between the device and at least one of a wall of the room and an object in the room.

The estimating may include estimating the distance information based on a distance between the first position and the second position.

The estimating may include: mapping the first reflection signal and the second reflection signal based on a distance between the first position and the second position; and estimating the distance information about the room based on the mapped first and second reflection signals.

The mapping may include mapping the first reflection signal and the second reflection signal based on a time for the audio signal to travel the distance between the first position and the second position.

The first reflection signal and the second reflection signal may be reflected from at least one of a wall of the room and an object in the room.

The estimating may include estimating information about a distance between the device and at least one a wall of the room and an object in the room.

The acquiring of the angle information may include acquiring at least one of an angle with respect to at least one wall of the room and an angle with respect to a corner between walls of the room.

The acquiring of the angle information may include: acquiring angle information about the room based on a user input with respect to at least one of a wall of the room and a corner of the room; and storing the acquired angle information.

According to an aspect of one or more exemplary embodiments, there is provided a device including: an audio outputter; an audio receiver; a sensor configured to acquire angle information about a room; and a controller configured to control the audio outputter to output an audio signal at a first position in the room, control the audio receiver to receive a first reflection signal of the audio signal at the first position, control the audio outputter to output the audio signal at a second position in the room, control the audio receiver to receive a second reflection signal of the audio signal at the second position, estimate distance information about the room using the received first and second reflection signals, and generate a floor plan illustrating a structure of the room using the estimated distance information and the acquired angle information.

The controller may be further configured to generate a three-dimensional (3D) model illustrating the structure of the room based on the floor plan.

The controller may be further configured to generate a three-dimensional (3D) model illustrating the structure of the room based on the floor plan and information about objects in the room.

The distance information may indicate a distance between the device and at least one of a wall of the room and an object in the room.

The controller may be further configured to estimate the distance information based on a distance between the first position and the second position.

The controller may be further configured to: map the first reflection signal and the second reflection signal based on a distance between the first position and the second position; and estimate the distance information about the room based on the mapped first and second reflection signals.

The controller may be further configured to map the first reflection signal and the second reflection signal based on a time for the audio signal to travel the distance between the first position and the second position.

The device may further include a user interface configured to acquire the first reflection signal and the second reflection signal that are reflected from at least one of a wall of the room and an object in the room.

The controller may be further configured to estimate information about a distance between the device and at least one of a wall of the room and an object in the room.

The sensor may be further configured to acquire at least one of an angle with respect to a wall of the room and an angle with respect to a corner between walls of the room.

The device may further include a user interface configured to receive a user input.

The controller may be further configured to control the sensor to acquire the angle information about the room in response to the received user input.

According an aspect of to one or more exemplary embodiments, there is provided a non-transitory computer-readable recording medium having embedded thereon a program for executing the method.

According to an aspect of one or more exemplary embodiments, there is provided a device including: a speaker; a microphone; a sensor configured to acquire angle information about a room; and a controller configured to: control the speaker to output an audio signal from a first position in the room, control the microphone to receive a first reflection signal of the audio signal output from the first position, control the speaker to output the audio signal from a second position in the room, control the audio receiver to receive a second reflection signal of the audio signal output from the second position, estimate distance information about the room using the received first reflection signal and the received second reflection signal, control the sensor to acquire the angle information, and generate room structure information of the room based on the estimated distance information and the acquired angle information.

The sensor may include a camera.

The controller may be further configured to: control the camera to capture an image of at least one of a wall of the room and a corner of the room, and estimate the angle information based on the captured image.

The controller may be further configured to: control the camera to capture an image of at least one of a wall of the room and a corner of the room from at least one of the first position and the second position, and estimate the angle information based on the captured image.

The controller may be further configured to: extract a plurality of peaks from the first reflection signal, extract a plurality of peaks from the second reflection signal, map the plurality of peaks of the second reflection signal to the plurality of peaks of the first reflection signal based on a distance between the first position and the second position, and estimate the distance information using the mapped plurality of peaks.

BRIEF DESCRIPTION OF THE DRAWINGS

These and/or other aspects will become apparent and more readily appreciated from the following description of certain exemplary embodiments, taken in conjunction with the accompanying drawings in which.

DETAILED DESCRIPTION

Figure 1:
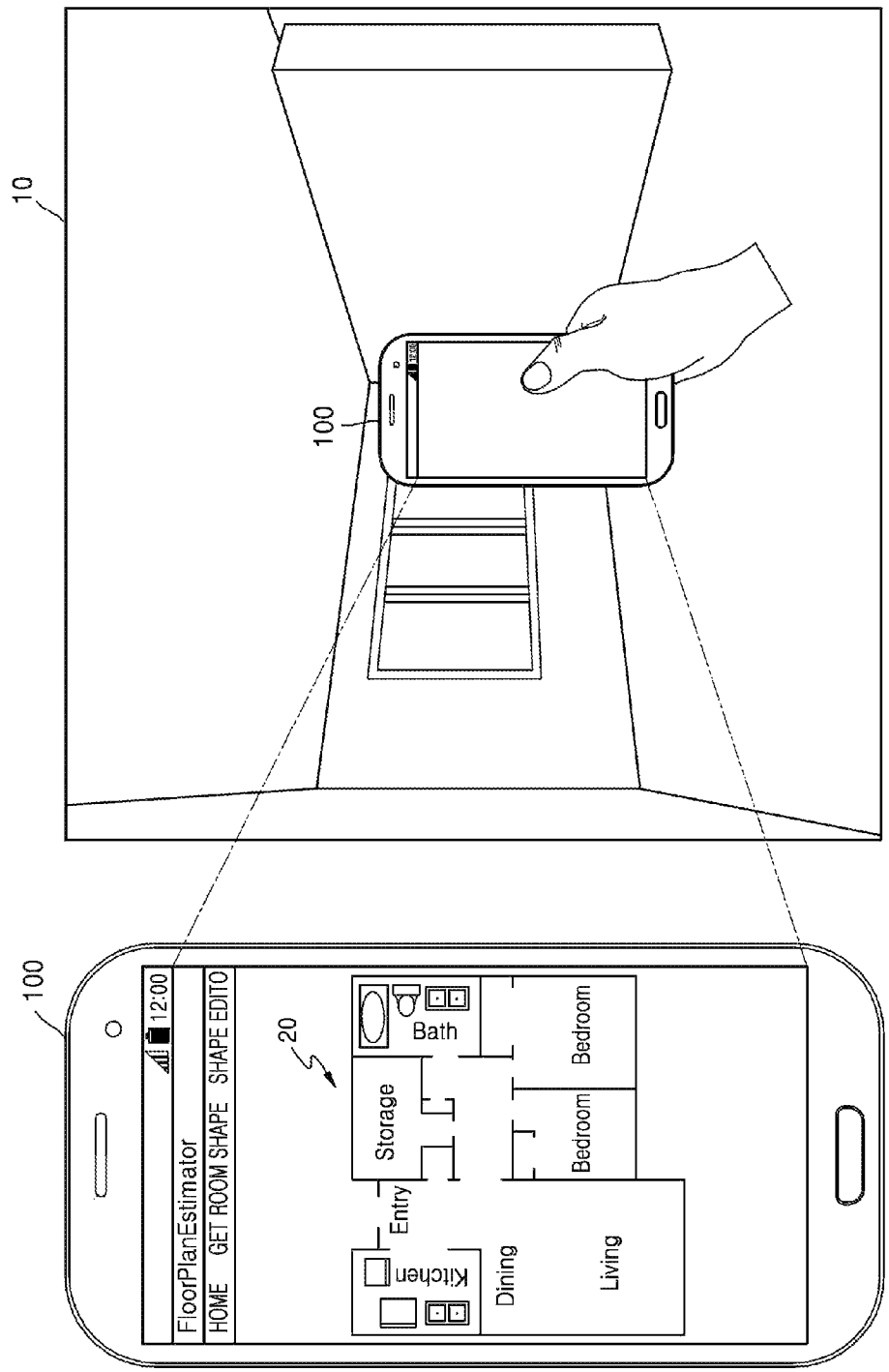
FIG. 1 is a diagram illustrating a method of generating data representing a structure of a room on a device, according to an exemplary embodiment.

Reference will now be made in detail to certain exemplary embodiments, examples of which are illustrated in the accompanying drawings, wherein like reference numerals refer to like elements throughout. In this regard, one or more exemplary embodiments may have different forms and should not be construed as being limited to the descriptions set forth herein. Accordingly, one or more exemplary embodiments are described below, by referring to the figures, to explain one or more aspects of the present description. Expressions such as "at least one of," when preceding a list of elements, modify the entire list of elements and do not modify the individual elements of the list.

The terminology or words used in this specification and claims should not be construed as general terms or meanings defined in a dictionary, but should be construed consistent with the scope of the inventive concept as would be understood by one of ordinary skill in the art.

It will be understood that when an element is referred to as being "on," "connected to," or "coupled to" another element, it may be directly on, connected or coupled to the other element or intervening elements may be present. It will be understood that the terms such as "comprise," "include," and "have," when used herein, specify the presence of stated elements, but do not preclude the presence or addition of one or more other elements.

Hereinafter, certain exemplary embodiments will be described in detail with reference to the accompanying drawings.

FIG. 1 is a diagram illustrating a method of generating data representing a structure of a room 10 on a device 100, according to an exemplary embodiment.

Referring to FIG. 1, a user may determine the structure of the room 10 by using the device 100. Specifically, the device 100 may generate data representing the structure of the room 10 and provide the generated data to the user, so that the user may determine the geometric structure of the room 10 through the device 100.

According to the exemplary embodiment, the device 100 may be a portable electronic device. For example, the device 100 may be a smartphone, a mobile phone, a digital television (TV), a kiosk, a personal digital assistant (PDA), a laptop computer, a media player, a global positioning system (GPS) device, or other mobile computing devices, but is not limited thereto. In addition, the device 100 may include various devices, such as a speaker or a microphone, which are capable of transmitting and receiving audio signals.

The room 10, the structure of which is determined by the device 100, is within a building where the user is located. For example, the room 10 may be, as non-limiting examples, a house, a shopping center, an office, a factory, or a room thereof. In addition, the room 10 is not limited thereto and may include a closed or open space defined by at least one wall.

The data representing the structure of the room 10 may a visual representation of the structure of the room, but is not limited thereto. The data may be data of various formats. For example, the data representing the structure of the room 10 may be a floor plan 20, a three-dimensional (3D) model, or a preview model.

The user may determine the structure of the room 10 at a glance by using the generated data representing the structure of the room 10 and may use a navigation service within a building.

The device 100 may output an audio signal and acquire a first reflection signal and a second reflection signal of the audio signal at a first position and a second position, respectively. When the user sequentially moves the device 100 to the first position and the second position, the device 100 may acquire the first reflection signal by outputting the audio signal at the first position and may acquire the second reflection signal by outputting the audio signal at the second position. The audio signal may be a predetermined audio signal. The audio signal may be within a human auditory range or outside the human auditory range. The audio signal may include a portion within the human auditory range and a portion outside the human auditory range.

The device 100 may estimate distance information about the room 10 by using the acquired first and second reflection signals. For example, the first and second reflection signals may be signals that return to the device 100 after the audio signal output from the device 100 is reflected from at least one wall of the room 10. The distance information about the room 10 may be information indicating a distance between the device 100 and the at least one wall of the room 10, from which the audio signal is reflected. In addition, the distance information may be information indicating a distance between the device 100 and at least one object in the room 10, from which the audio signal is reflected. The object in the room 10 may be any objects capable of being locatable in the room 10 and having a physical volume. For example, the object may be a television, a desk, a chair, a bed, a sofa, or decorations.

The device 100 may acquire at least one of angle information about the room 10. The angle information about the room 10 may be information indicating an angle with respect to at least one wall of the room 10 or an angle with respect to a corner between walls of the room 10. For example, the angle information about the room 10 may be information indicating the azimuth. For example, the angle information may indicate an angle between 0 degrees and 360 degrees when measured clockwise, when it is assumed that the north is a reference position corresponding to 0 degree.

The device 100 may generate the data representing the structure of the room 10 by using the estimated distance information and the acquired angle information about the room 10. For example, the device 100 may generate and display the floor plan 20 illustrating the structure of the room 10. In addition, the device 100 may generate and display a 3D model illustrating the structure of the room 10 or print a 3D model by using a 3D printer. In addition, the device 100 may generate a preview model by using the information about the objects in the room 10. The device 100 may generate a preview model illustrating the structure of the room 10 by adding the information about the objects to the generated floor plan or 3D model.

The preview model may be a 3D model including an environment of the room as would be experienced by a user. For example, the preview model may include objects, such as a door, a window, a piece of furniture, wallpaper, or decorations, which may be located in the room 10. The objects may be detected in the room and placed in the 3D model, the objects may be automatically generated, or a user may place the objects into the 3D model.

The device 100 may determine the structure of the room 10 where the user is located and provide the determined structure of the room 10 to the user. Therefore, the user may determine the structure of the room 10 at a glance and use a navigation server even in the room 10. In addition, the device 100 may provide the data representing the structure of the room 10 to a user (for example, a visually handicapped person) who cannot directly observe the structure of the room 10 in an auditory or visual manner.

Figure 2B:
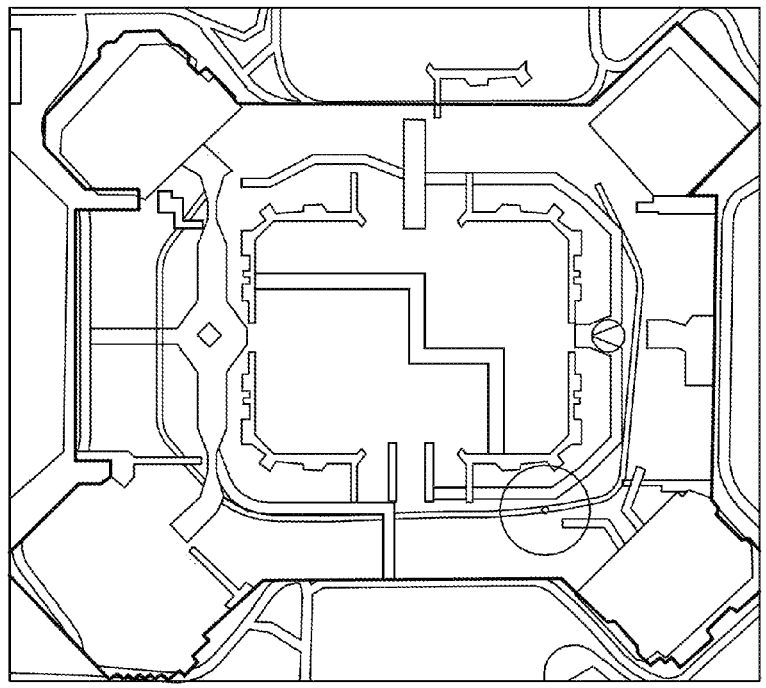
FIGS. 2A and 2B are diagrams showing use of data representing a structure of a room on a device, according to an exemplary embodiment.
Figure 2A:
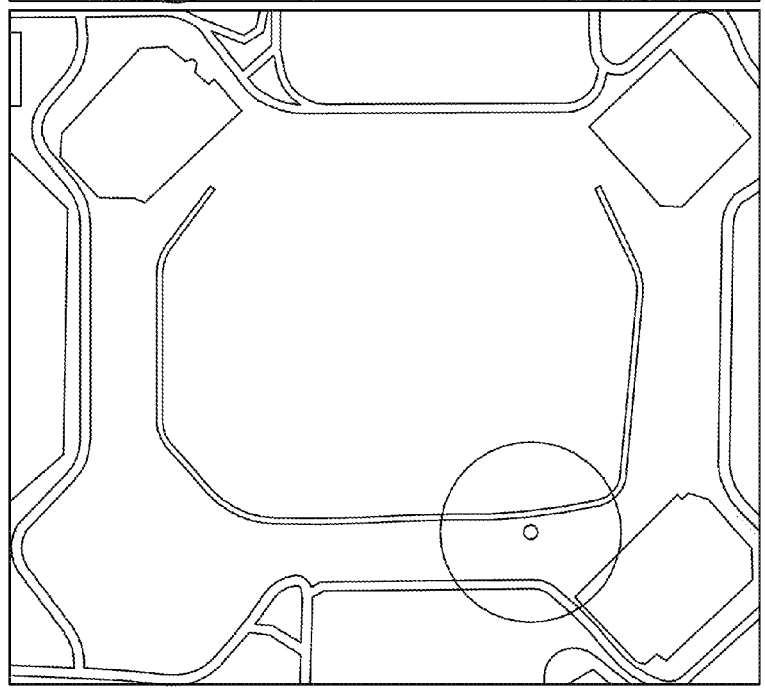

FIGS. 2A and 2B are diagrams showing use of data representing a structure of a room on the device 100, according to an exemplary embodiment.

FIG. 2A illustrates a map including a region where a building is located. For example, the map of FIG. 2A may be a map acquired by using a global positioning system (GPS). FIG. 2B illustrates a map acquired by using data representing a structure of a room on the device 100, according to an exemplary embodiment. The map of FIG. 2B may illustrate the same region as that of FIG. 2A.

For example, the device 100 may generate the map of FIG. 2B by using the data representing the structure of the room, in combination with the map of FIG. 2A that is acquired by using the GPS.

The device 100 may provide the user with the data representing the structure of the room, so that the user determines the structure of the building where the user is currently located. In addition, the device 100 may provide the user with the map including the data representing the structure of rooms, so that the user easily may navigate within and between the rooms.

The device 100 may store the generated data representing the structure of the room and provide the user with the map including the data representing the structure of the user even when the user moves to another place.

Figure 3:
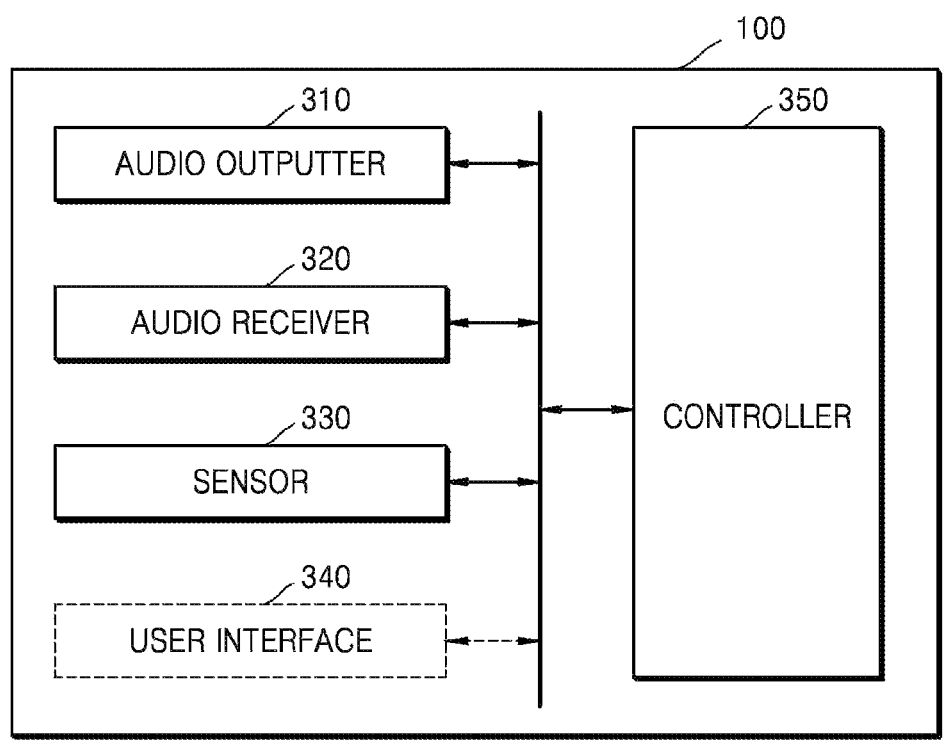
FIG. 3 is a block diagram of a device for generating data representing a structure of a room, according to an exemplary embodiment.

FIG. 3 is a block diagram of a device 100 for generating data representing a structure of a room, according to an exemplary embodiment.

According to the exemplary embodiment, the device 100 may include an audio outputter 310, i.e., an audio output unit, an audio receiver 320, i.e., an audio reception unit, a sensor 330, i.e., a sensing unit, and a controller 350, i.e., a control unit. In addition, according to another exemplary embodiment, the device 100 may further include a user interface 340, i.e., a user input unit or a user interface.

The hardware components illustrated in FIG. 3 will be described below. However, it will be understood by those skilled in the art that the device 100 may further general-purpose hardware components as well as the hardware components illustrated in FIG. 3.

The audio outputter 310 may output audio data stored in the device 100. The audio data may be an audio signal. The audio outputter 310 may include a speaker, a buzzer, or the like. For example, the audio outputter 310 may include any type of a loudspeaker that is usable in the device 100, but is not limited thereto. The audio outputter 310 may include a parametric speaker.

The audio outputter 310 may output an audio signal. The audio outputter 310 may sequentially output the audio signal at the first position and the second position under the control of the controller 350. When the user moves the device 100 to the first position and the second position, the audio outputter 310 may sequentially output the audio signal at the first position and the second position according to a user input.

The audio signal may be a sine sweep, a maximum length sequence (MLS), or an acoustic energy waveform of a predetermined frequency band. The predetermined frequency band may be an audible frequency or an ultrasonic frequency.

The audio receiver 320 may be configured to receive an audio signal from the outside of the device 100 and transmit the received audio signal to the controller 350. The audio receiver 320 may include a microphone. The audio receiver 320 may include any type of a microphone that is usable in the device 100, but is not limited thereto. The audio receiver 320 may include a directional microphone or an omnidirectional microphone.

The audio receiver 320 may receive a reflection signal of the audio signal. The audio receiver 320 may receive a first reflection signal at the first position with respect to the audio signal output at the first position. In addition, the audio receiver 320 may receive a second reflection signal at the second position with respect to the audio signal output at the second position.

The first reflection signal and the second reflection signal may return to the audio receiver 320 after the audio signal output from the audio outputter 310 is reflected from at least one wall of the room or an object in the room.

The audio receiver 320 may acquire the first reflection signal or the second reflection signal by continuously or substantially continuously receiving audio signals for a predetermined time after the audio signal is output from the audio outputter 310.

The sensor 330 may be configured to acquire angle information about the room. The sensor 330 may include various sensors configured to sense a state of the device 100.

The sensor 330 may include a camera, i.e., a camera sensor, configured to capture an image. The sensor 330 may transmit the captured image to the controller 350 or a display, i.e., a display unit.

In addition, the sensor 330 may include a terrestrial magnetism sensor, a gyroscope sensor, an acceleration sensor, a gravity sensor, a tilt sensor, and the like.

For example, the sensor 330 may acquire at least one of angle information about the room by using the camera sensor and the terrestrial magnetism sensor.

The user interface 340 may be configured to allow the user to input information and control the device 100. For example, the user interface 340 may include a keypad, a dome switch, a touch pad, a jog wheel, and a jog switch.

The user interface 340 may receive a user input for estimating distance information about the room. For example, the user interface 340 may receive a user input for outputting the audio signal at the first position. Also, the user interface 340 may receive a user input for outputting the audio signal at the second position.

The user interface 340 may receive a user input for acquiring angle information about the room.

In addition, the user interface 340 may receive a user input for generating data representing various structures of the room.

The controller 350 may be configured to control an overall operation of the device 100. The controller 350 may include a central processing unit (CPU).

The controller 350 may control the audio outputter 310 to output the audio signal at the first position of the room and control the audio receiver 320 to receive the first reflection signal of the audio signal at the first position of the room. The controller 350 may control the audio outputter 310 to output the audio signal when the user input is received at the first position of the room and control the audio receiver 320 to receive the first reflection signal when the audio signal is output.

In addition, the controller 350 may control the audio outputter 310 to output the audio signal at the second position of the room and control the audio receiver 320 to receive the second reflection signal of the audio signal at the second position of the room. The controller 350 may control the audio outputter 310 to output the audio signal when the user input is received at the second position of the room and the audio receiver 320 to receive the second reflection signal when the audio signal is output.

The controller 350 may estimate distance information about the room by using the received first and second reflection signals. For example, the first and second reflection signals may be signals that return to the device 100 after the audio signal output from the device 100 is reflected from at least one wall of the room. The distance information about the room may be information indicating a distance between the device 100 and the at least one wall of the room, from which the audio signal is reflected. In addition, the distance information about the room may be information indicating a distance between the device 100 and at least one object in the room, from which the audio signal is reflected.

Specifically, the controller 350 may post-process the received first and second reflection signals to estimate the distance information about the room.

For example, the controller 350 may generate impulse responses of the first and second reflection signals by performing deconvolution on the first and second reflection signals. The controller 350 may generate the impulse response of the first reflection signal by performing the deconvolution on the first reflection signal, and may generate the impulse signal of the second reflection signal by performing the deconvolution on the second reflection signal.

The controller 350 may filter the impulse responses of the first and second reflection signals to reduce noise of the signals. Furthermore, the controller 350 may auto-correlate the impulse responses of the first and second reflection signals to reduce noise and emphasize the first and second reflection signals.

The controller 350 may extract a plurality of peaks from the post-processed first reflection signal and extract a plurality of peaks from the post-processed second reflection signal. For example, the plurality of peaks may be disposed adjacent to one another on a time axis. The peaks of one audio reflection signal may be clustered.

The controller 350 may map the first reflection signal and the second reflection signal, from which the peaks are extracted, based on a distance between the first position and the second position, and estimate distance information about the room based on the mapping.

Specifically, the controller 350 may map the second reflection signal, from which the peaks are extracted, with the first reflection signal by time-shifting the second reflection signal according to the time for the audio signal to travel a distance between the first position and the second position. The distance between the first position and the second position is a distance by which the user moves the device 100 and may be measured by the controller 350 when the device 100 is moved. A speed of the audio signal may be previously determined to be about 340 m/s, which is a speed of the audio signal in air at room temperature. Therefore, the controller 350 may calculate the time to travel the distance between the first position and the second position by using the previously determined speed of the audio signal. However, the speed of the audio signal may be determined according to the environment of the room. For example, the speed of the audio signal may be based on at least one of air temperature, elevation, humidity, and barometric pressure within the room.

The controller 350 may estimate distance information about the room by mapping the first reflection signal and the time-shifted second reflection signal. Specifically, the controller 350 may map peaks that are mapped at the same time among the peaks of the first reflection signal and the peaks of the time-shifted second reflection signal.

The controller 350 may estimate information indicating a distance to at least one wall of the room or at least one object in the room by using a signal of an earliest peak among the peaks mapped at the same time. The controller 350 may estimate the distance information about the room by using the peak time of the earliest peak of the signal and the previously determined speed of the audio signal. The controller 350 may determine, as noise signals, signals of the peaks other than the earliest peak among the peaks mapped at the same time.

In addition, the controller 350 may control the sensor 330 to acquire at least one of an angle with respect to at least one wall of the room and an angle with respect to a corner between walls of the room. The angle with respect to the wall or the angle with respect to the corner may be, for example, an azimuth measured using a terrestrial magnetism sensor.

When the device 100 receives a user input for acquiring the angle information while being directed toward at least one wall of the room, the controller 350 may control the sensor 330 to acquire the angle with respect to the wall. In addition, when the device 100 receives a user input while being directed toward a corner between two walls of the room, the controller 350 may control the sensor 330 to acquire the angle with respect to the corner. The user may arrange the device 100 to be accurately directed toward the wall or the corner by using a camera of the sensor 330 and a display.

The controller 350 may generate the data representing the structure of the room by using the estimated distance information about the room and at least one of the acquired angle information. For example, the controller 350 may generate a floor plan illustrating the structure of the room and may generate a 3D model illustrating the structure of the room. The controller 350 may generate a preview model illustrating the structure of the room by adding the data representing the structure of the object to the 3D model by using the information about the objects in the room.

FIGS. 4A to 7 are diagrams of a process of estimating distance information about a room 40 on a device 100 by using an audio signal, according to one or more exemplary embodiments.

Figure 4A:
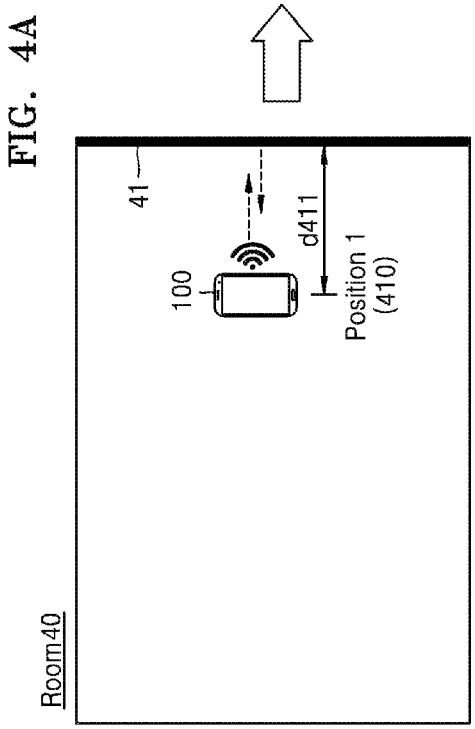
FIGS. 4A and 4B are diagrams of a process of acquiring reflection signals of an audio signal on a device, according to an exemplary embodiment.
Figure 4B:
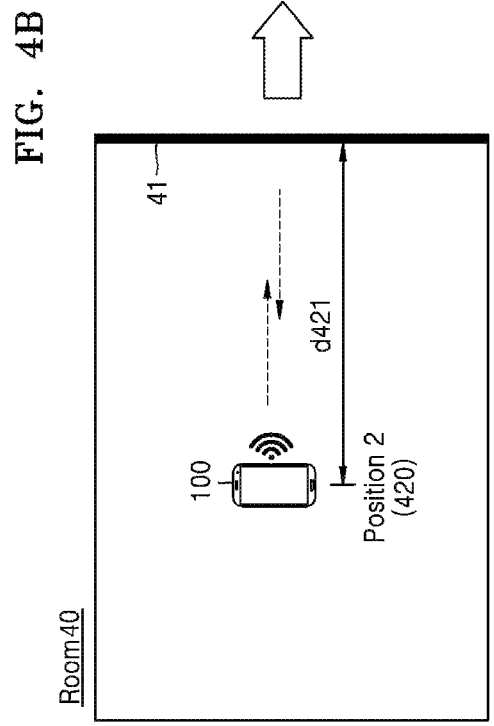

FIGS. 4A and 4B are diagrams of a process of acquiring reflection signals of an audio signal on the device 100, according to an exemplary embodiment.

In FIG. 4A, the device 100 may output the audio signal at a first position 410 in the room 40. The audio signal may be reflected by a wall 41 of the room 40, and the device 100 may receive a first reflection signal reflected from the wall 41 at the first position 410.

In addition, a plurality of reflection signals may be generated when the audio signal is reflected from other walls, in addition to the wall 41, or objects in the room 40. Therefore, the device 100 may receive the first reflection signal including the plurality of reflection signals by continuously or substantially continuously receiving audio signals for a predetermined time after the audio signal is output at the first position 410. For example, the first reflection signal may be represented by a graph 412. In the graph 412, an X axis may be the time and a Y axis may be the amplitude of the first reflection signal.

In FIG. 4B, the device 100 may output the audio signal at the second position 420 of the room 40. The device 100 may be moved from the first position 410 to the second position 420 by the user. The audio signal, which is output at the second position 420, may be reflected from the wall 41 of the room 40, and the device 100 may receive the second reflection signal reflected from the wall 41 at the second position 420.

In addition, a plurality of reflection signals may be generated when the audio signal is reflected from other walls, in addition to the wall 40, or objects in the room 40. Therefore, the device 100 may receive the second reflection signal including the plurality of reflection signals by continuously or substantially continuously receiving audio signals for a predetermined time after the audio signal is output at the second position 420. For example, the second reflection signal may be represented by a graph 422. In the graph 422, an X axis may be the time and a Y axis may be the amplitude of the signal.

Figure 5A:
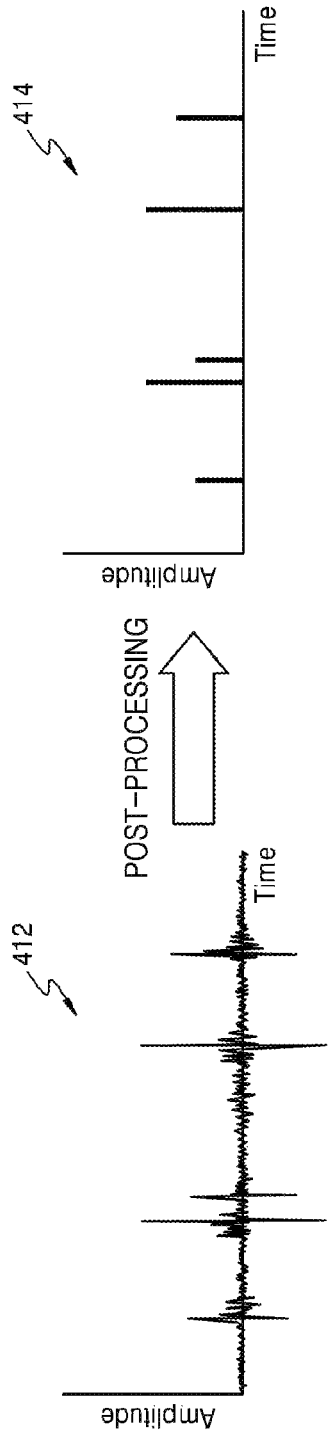
FIGS. 5A and 5B are diagrams of a process of post-processing acquired reflection signals on a device, according to an exemplary embodiment.
Figure 5B:
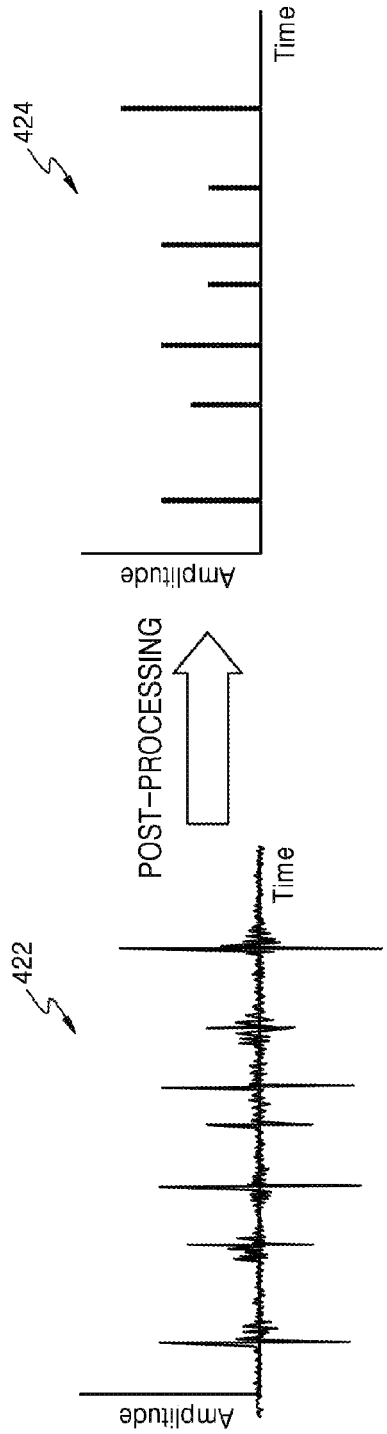

FIGS. 5A and 5B are diagrams of a process of post-processing the acquired reflection signals in the device 100, according to an exemplary embodiment.

Referring to FIG. 5A, the first reflection signal may be post-processed by the device 100. For example, the device 100 may generate an impulse response of the first reflection signal by performing the deconvolution on the first reflection signal from the audio signal, and may filter and auto-correlate the impulse response of the first reflection signal. The device 100 may extract a plurality of peaks from the post-processed first reflection signal and output the plurality of peaks of the first reflection signal as illustrated in an input response graph 414. The peaks illustrated in the input response graph 414 may represent reflection signals of the audio signal output at the first position 410. In the input response graph 414, an X axis may be the time and a Y axis may be the amplitude of the impulse response of the first reflection signal.

Referring to FIG. 5B, the second reflection signal may be post-processed by the device 100 in the same manner as the first reflection signal. The device 100 may extract a plurality of peaks from the post-processed second reflection signal and output the plurality of peaks of the second reflection signal as illustrated in an input response graph 424. The peaks illustrated in the input response graph 424 may represent reflection signals of the audio signal output at the second position 420. In the input response graph 424, an X axis may be the time and a Y axis may be the amplitude of the impulse response of the second reflection signal.

Figure 6:
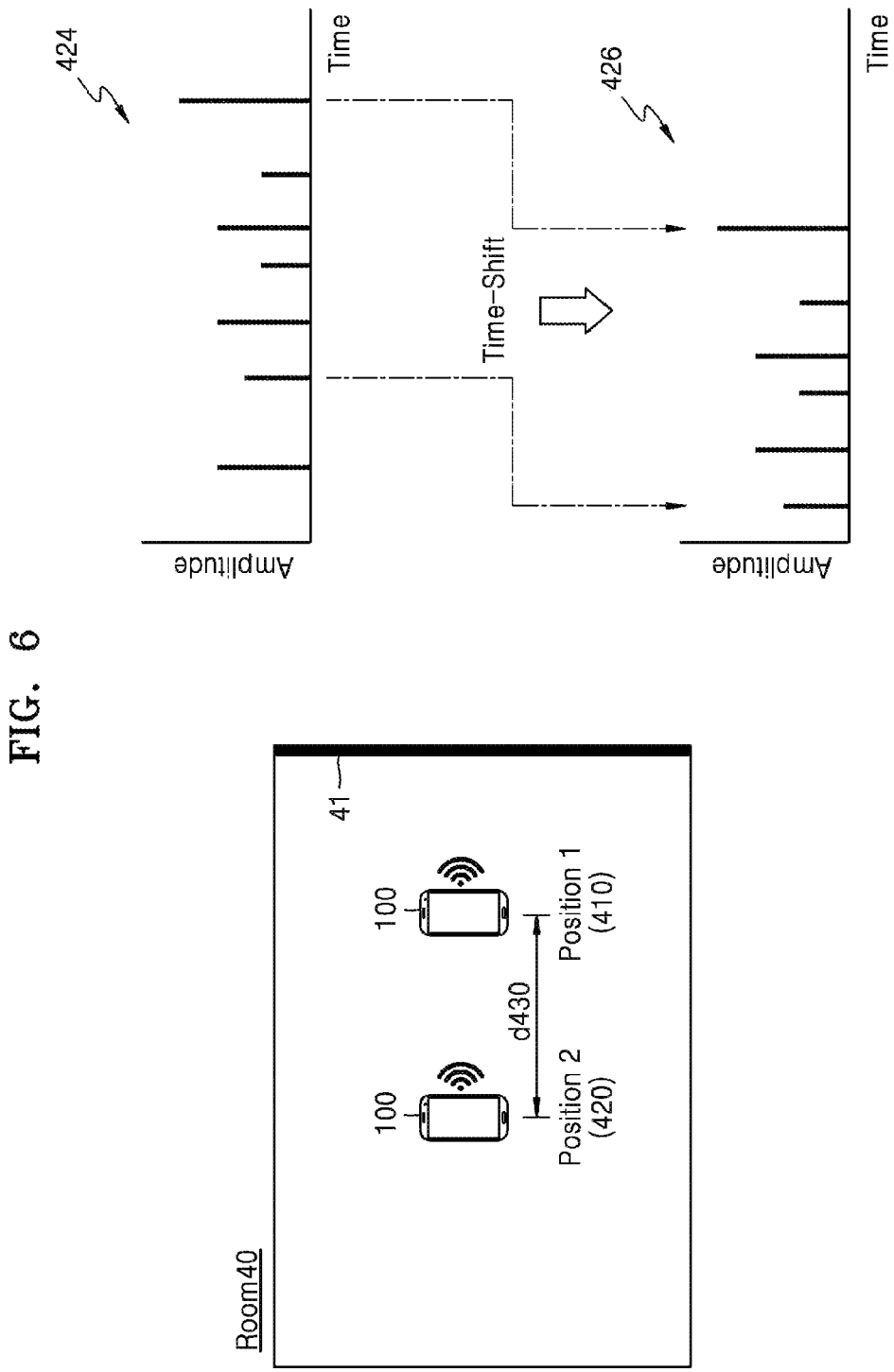
FIGS. 6 and 7 are diagrams of a process of mapping acquired reflection signals on a device, according to an exemplary embodiment.
Figure 7:
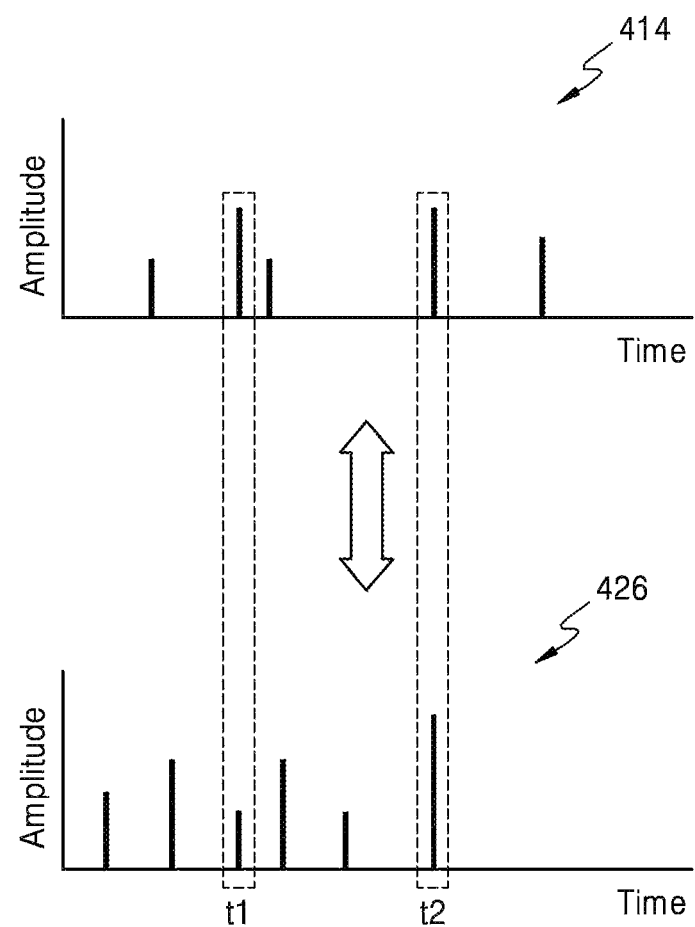

FIGS. 6 and 7 are diagrams of a process of mapping the acquired reflection signals on the device 100, according to an exemplary embodiment.

Referring to FIG. 6, the device 100 may measure a distance d430 between a first position 410 and a second position 420. For example, when the user moves the device 100 from the first position 410 to the second position 420, the device 100 may measure the distance d430 between the first position 410 and the second position 420 by using an acceleration sensor or a GPS.

The device 100 may time-shift the second reflection signal by using the measured distance d430. Specifically, the device 100 may time-shift the second reflection signal according to the time for the audio signal to travel the distance d430. The controller 100 may calculate the time for the audio signal to travel the distance d430 by using the previously determined speed of the audio signal. The time-shifted second reflection signal may be represented by a graph 426.

Alternatively, the device 100 may time-shift the first reflection signal instead of the second reflection signal. In a case where the first reflection signal is time-shifted, the device 100 may estimate a distance d421 between the second position 420 and the wall 41 of the room 40.

Referring to FIG. 7, the device 100 may map the first reflection signal illustrated in the input response graph 414 and the time-shifted second reflection signal illustrated in the graph 426. Specifically, the device 100 may map peaks that are mapped at the same time among the peaks of the first reflection signal and the peaks of the time-shifted second reflection signal. In FIG. 7, the peaks of the first reflection signals and the peaks of the time-shifted second reflection signal may be mapped at time t1 and time t2.

The device 100 may estimate the distance 411 between the device 100 and the wall 41 of the room by using the signal of the earliest peak among the peaks mapped at the same time. Specifically, the device 100 may estimate the distance 411 based on the time t1 of the earliest peak and the previously determined speed of the audio signal.

Figure 8:
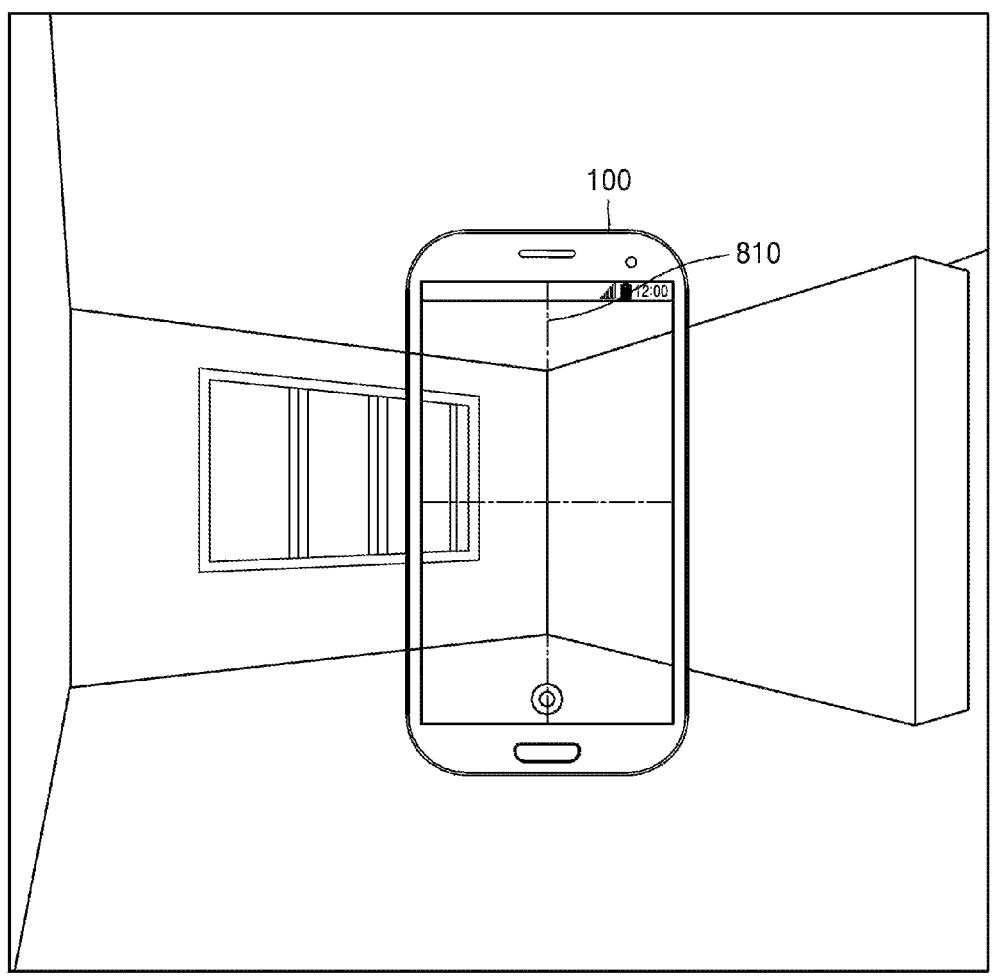
FIG. 8 is a diagram of a process of acquiring angle information about a room on a device, according to an exemplary embodiment.

FIG. 8 is a diagram of a process of acquiring angle information about a room 80 on the device 100, according to an exemplary embodiment.

A user may acquire at least one of angle information about the room 80 by using the device 100. The angle information about the room 80 may be information indicating an angle with respect to at least one wall of the room 80 or an angle with respect to a corner between walls of the room 80. The angle information about the room 80 may be information indicating an azimuth.

Referring to FIG. 8, the user may direct the device 100 toward at least one wall of the room 80, and the device 100 may acquire angle information about the at least one wall of the room 80. In addition, the user may direct the device 100 toward at least one corner of the room 80, and the device 100 may acquire angle information about the at least one corner of the room 80.

In order to acquire more accurate angle information, the device 100 may use a camera sensor to capture the room 80 in a direction in which the device 100 is directed and may display a captured image on a display. The user may acquire more accurate angle information by checking the position of the wall or the corner using the displayed image of the room 80 and an auxiliary line 810 displayed on the display. The auxiliary line 810 may be a solid line or a scale mark displayed on a screen and may be a fixed line displayed regardless of the movement of the image.

Figure 9:
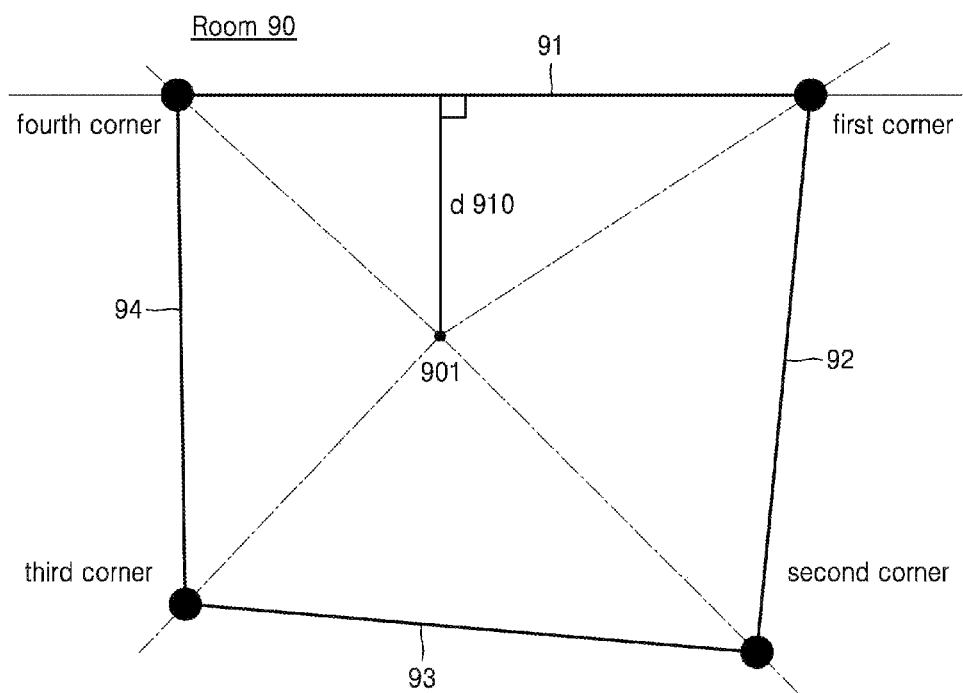
FIG. 9 is a diagram of a process of generating data representing a structure of a room on a device, according to an exemplary embodiment.

The device 100 may acquire a plurality of pieces of angle information and store the acquired angle information. The device 100 may acquire the plurality of pieces of angle information either continuously or substantially continuously FIG. 9 is a diagram of a process of generating data representing a structure of a room 90 on the device 100, according to an exemplary embodiment.

The device 100 may generate the data representing the structure of the room 90 by using distance information and angle information about the room 90. The device 100 may generate a floor plan illustrating the structure of the room 90 as illustrated in FIG. 9.

The device 100 may estimate a distance d910 between a position 901 of the device 100 and at least one wall 91 of the room 90 by using reflection signals of an audio signal. In addition, the device 100 may acquire at least one of angle information about the room 90. For example, the device 100 may acquire angle information about at least one of walls 91, 92, 93, and 94 of the room 90 or angle information about at least one of first to fourth corners of the room. The device 100 may acquire the angle information as information indicating an azimuth with respect to the position 901 of the device 100.

The device 100 may generate a floor plan illustrating the structure of the room 90 based on the acquired angle information and the information about the estimated distance d910. The device 100 may display the floor plan illustrating the structure of the room 90.

The device 100 may store the floor plan, that is, the data representing the structure of the room 90, and provide a map including the data representing the structure of the room 90 even when the user moves to another place.

Figure 10A:
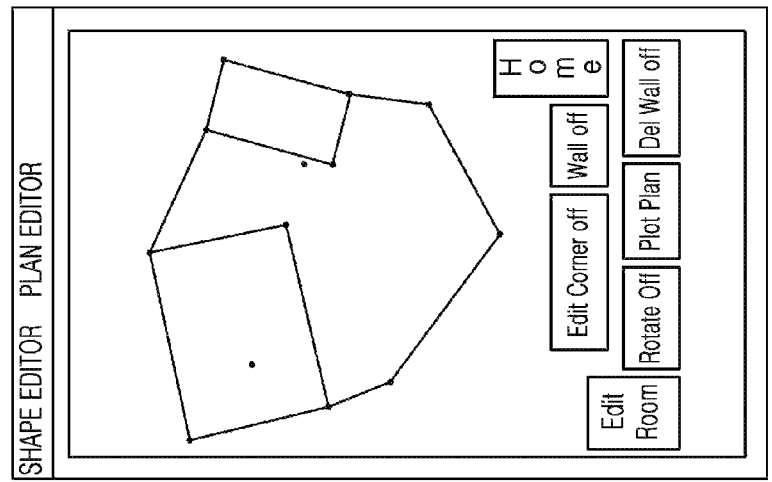
FIGS. 10A to 10C illustrate screens of user interfaces provided to generate data representing a structure of a room on a device, according to an exemplary embodiment.
Figure 10B:
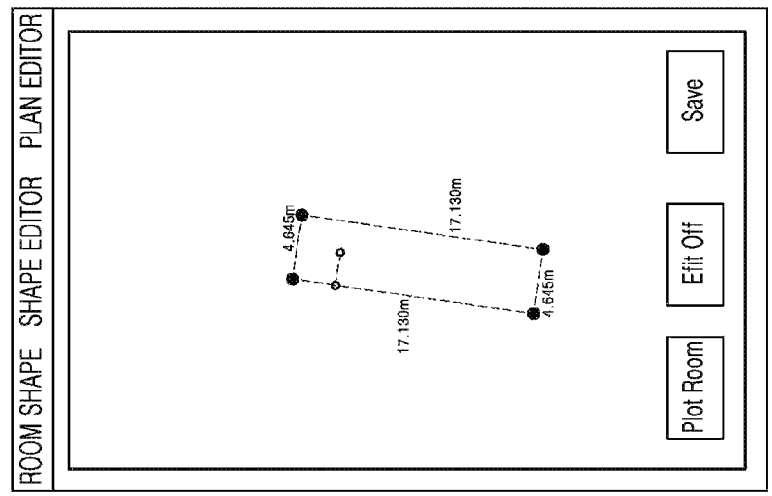
Figure 10C:
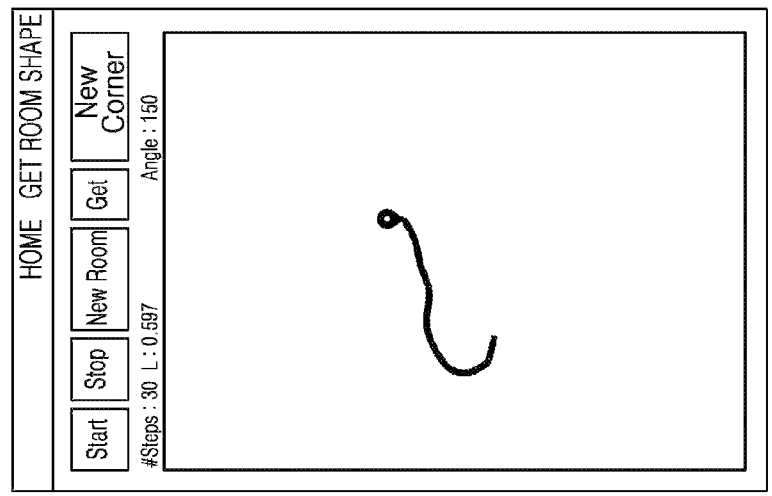

FIGS. 10A to 10C illustrate screens of user interfaces provided to generate data representing a structure of a room 90 on the device 100, according to an exemplary embodiment;

Referring to FIG. 10A, the device 100 may measure a moving distance of a user. For example, in a case where the user who holds the device 100 moves from a first position to a second position, the device 100 may measure the moving distance of the user by using an acceleration sensor or a GPS. Alternatively, the device 100 may estimate the moving distance of the user by measuring a step count of the user.

In addition, the device 100 may track a moving route of the user. For example, in a case where the user who holds the device 100 moves from the first position to the second position, the device 100 may track the moving route of the user by using a terrestrial magnetism sensor or a GPS and display the tracked moving route of the user. The device 100 may determine relative positions between different rooms by tracking the moving route of the user.

As illustrated in FIG. 10A, the device 100 may provide a user interface configured to estimate the moving distance or the moving route of the user.

Referring to FIG. 10B, the device 100 may display the generated data illustrating the structure of the room. For example, the device 100 may display the floor plan illustrating the structure of the room. The device 100 may also display values representing dimensions of the floor plan.

In addition, the device 100 may provide a user interface configured to modify the generated data illustrating the structure of the room. The user may modify the displayed floor plan by using the user interface. The user may input a name of the room by using the user interface.

Referring to FIG. 10C, the device 100 may display data illustrating the structure of multiple rooms. The device 100 may generate a single representation representing the structure of an entire building by merging the data representing the structure of multiple rooms. For example, the device 100 may generate data illustrating an entire structure of a house by merging data regarding rooms of the house.

The device 100 may merge data by tracking the movement route of the user. In addition, the device 100 may merge data by using angle information about the room.

In addition, the device 100 may generate data representing an entire structure of a building having multiple stories by merging data representing a structure of the respective stories.

The device 100 may display the merged data illustrating the entire structure of the building. In addition, the device 100 may provide a user interface configured to enable a user to modify the generated data illustrating the entire structure of the building. The user may modify the displayed data by using the user interface.

The device 100 may store the generated data representing the structure of the room and receive a navigation service for the room by providing the generated data to the navigation service.

Figure 11:
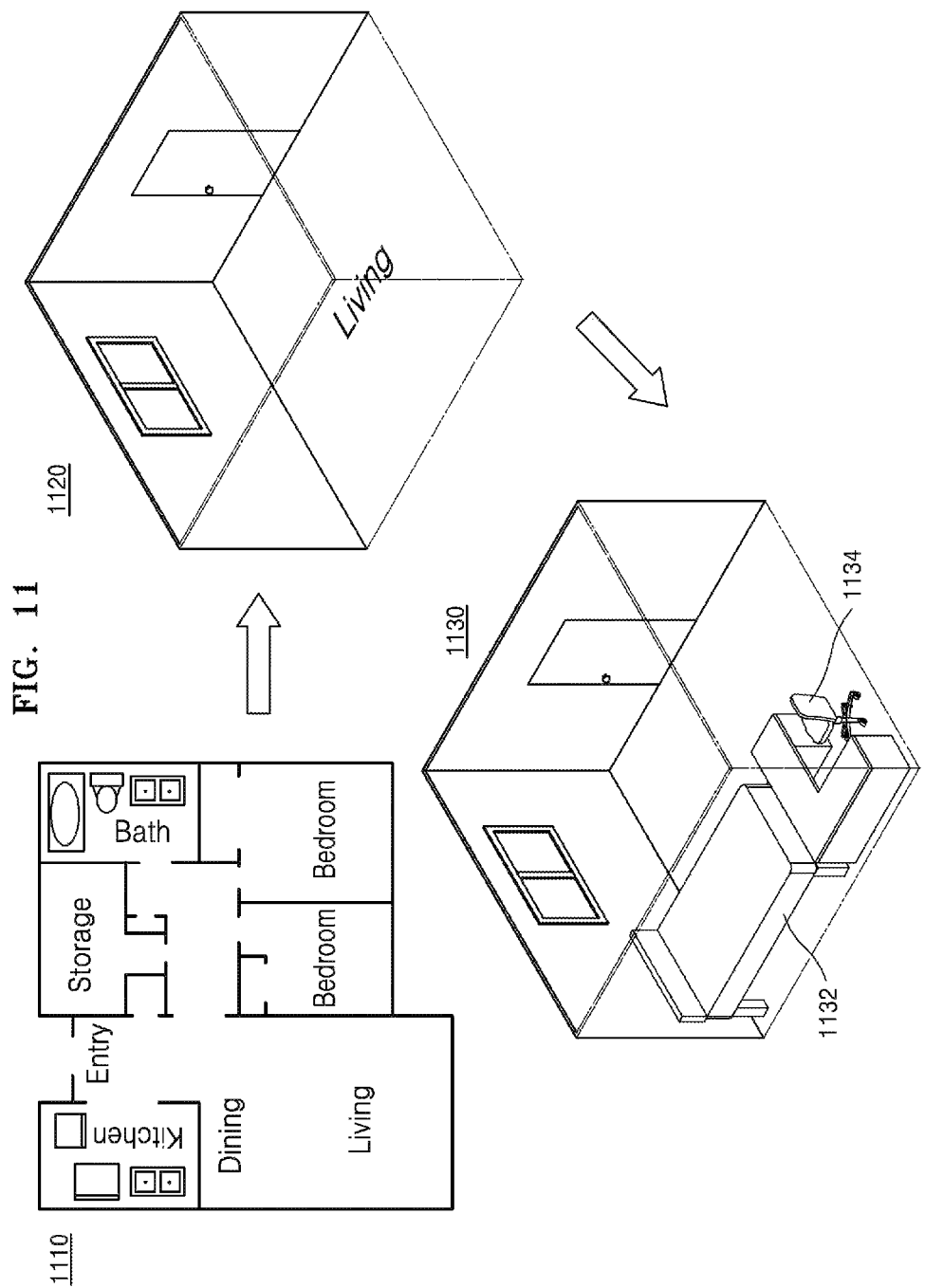
FIG. 11 is a diagram of a method of generating data representing a structure of a room on a device, according to an exemplary embodiment.

FIG. 11 is a diagram of a method of generating data representing a structure of a room on the device 100, according to an exemplary embodiment.

The device 100 may generate data illustrating the structure of the room and provide the generated data to a user. For example, the data representing the structure of the room may be a floor plan 1110, a 3D model 1120, or a preview model 1130. Alternatively, the device 100 may generate auditory data corresponding to the structure of the room, instead of visible data, and provide the generated auditory data to the user.

The device 100 may generate the floor plan 1110 illustrating the structure of the room by using estimated distance information and angle information about the room. The device 100 may generate the floor plan 110 representing an entire structure of a building by merging the generated data corresponding to a plurality of rooms.

The device 100 may generate the 3D model 1120 illustrating the structure of the room based on the generated floor plan 1110. For example, the user may direct the device 100 toward the ceiling, and the device 100 may acquire information about a distance between the device 100 and the ceiling. The device 100 may acquire angle information about a corner between at least one wall of the room and the ceiling.

The device 100 may generate the 3D model 1120 illustrating the structure of the room by using the information about the distance between the device 100 and the ceiling or the angle information about the corner between the wall and the ceiling, based on the floor plan 1110.

The device 100 may display the 3D model 1120. The device 100 may print the 3D model by using a 3D printer.

In addition, the device 100 may generate the preview model 1130 illustrating the structure of the room based on the floor plan 1110 or the 3D model 1120. The preview model 1130 may be a 3D model including environmental elements of the room. For example, the preview model 1130 may include objects, such as a door, a window, a piece of furniture, wallpaper, or decorations, which may be located in the room.

The device 100 may provide the user with information about various objects that may be included in the preview model 1130. For example, the device 100 may provide the user with information about names and dimensions of the objects or image information about the objects and receive a user input of selecting objects to be included in the preview model 1130.

In addition, the device 100 may directly acquire and use information about objects in the room. The device 100 may acquire dimension information about the objects in the room and use the acquired dimension information to generate the preview model 1130. The dimension information about the objects may be estimated by using the same or similar method as the method of estimating the distance information about the room, which has been described above with reference to FIGS. 4A to 7.

The device 100 may generate the preview model 1130 by merging the floor plan 1110 or the 3D model 1120 with the information about the selected objects. For example, the device 100 may generate and display the preview model 1130 by superimposing images of the selected objects 1132 and 1134 on the 3D model 1120.

The device 100 may scale the selected objects according to the dimension information about the selected objects and superimpose the scaled objects on the preview model 1130. Therefore, the user may observe the structure of the room including the selected objects through the preview model 1130.

Figure 12:
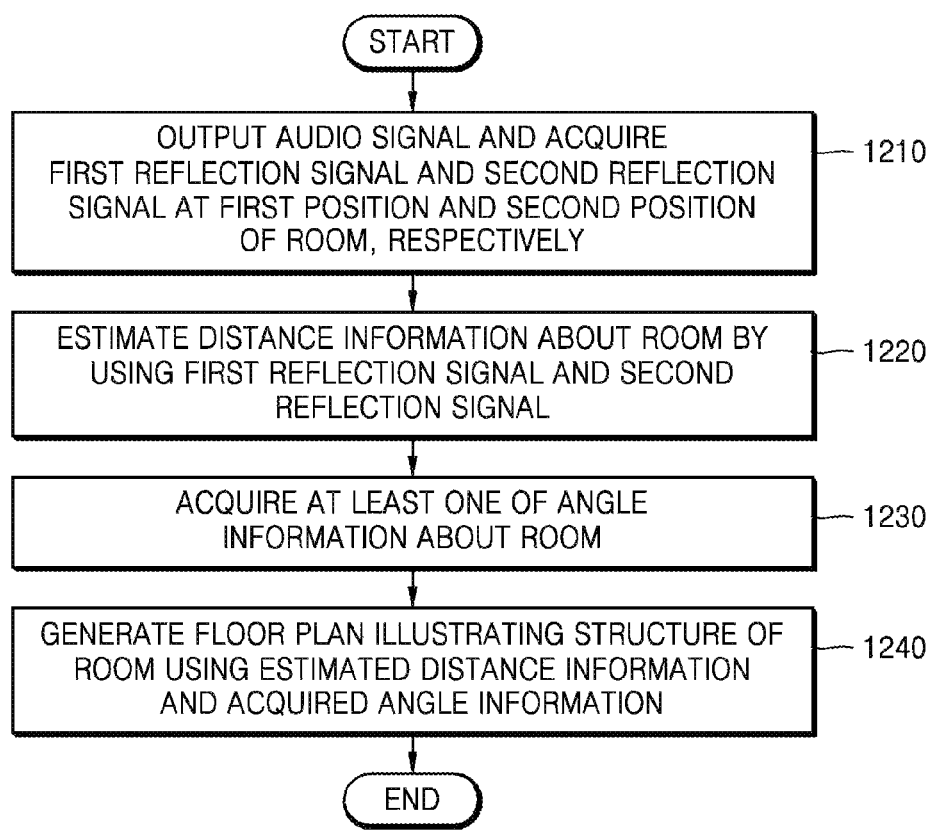
FIG. 12 is a flowchart of a method of generating data representing a structure of a room on a device, according to an exemplary embodiment.

FIG. 12 is a flowchart of a method of generating data representing a structure of a room on a device 100, according to an exemplary embodiment.

Referring to FIG. 12, in operation 1210, the device 100 may output an audio signal and acquire a first reflection signal and a second reflection signal at a first position and a second position.

The first reflection signal and the second reflection signal may return to the device 100 after the audio signal output from the device 100 is reflected from at least one wall of the room. When the user moves the device 100 to the first position and the second position, the device 100 may acquire the first reflection signal by outputting the audio signal at the first position and then acquire the second reflection signal by outputting the audio signal at the second position.

In operation 1220, the device 100 may estimate distance information about the room by using the acquired first and second reflection signals.

The distance information about the room may be information indicating a distance between the device 100 and at least one wall of the room, from which the audio signal is reflected.

The device 100 may post-process the received first and second reflection signals to estimate the distance information about the room.

For example, the device 100 may generate impulse responses of the first and second reflection signals by performing deconvolution on the first and second reflection signals. The device 100 may generate the impulse response of the first reflection signal by performing the deconvolution on the first reflection signal from the audio signal, and may generate the impulse signal of the second reflection signal by performing the deconvolution on the second reflection signal from the audio signal.

In addition, the device 100 may filter the impulse responses of the first and second reflection signals to reduce noise. The device 100 may auto-correlate the impulse responses of the first and second reflection signals to reduce noise and emphasize the first and second reflection signals.

In addition, the device 100 may extract a plurality of peaks from the post-processed first reflection signal and extract a plurality of peaks from the post-processed second reflection signal. The plurality of peaks may be disposed adjacent to one another on a time axis. The peaks may be clustered to represent one audio reflection signal.

The device 100 may map the first reflection signal and the second reflection signal, from which the peaks are extracted, based on a distance between the first position and the second position, and estimate distance information about the room based on the mapping.

The device 100 may map the second reflection signal, from which the peaks are extracted, with the first reflection signal by time-shifting the second reflection signal according to the time for the audio signal to travel a distance between the first position and the second position. The distance between the first position and the second position may be a distance by which the user moves the device 100 and may be measured by the device 100 when the device 100 is moved.

The device 100 may estimate distance information about the room by mapping the first reflection signal and the time-shifted second reflection signal. Specifically, the device 100 may map peaks that are mapped at the same time among the peaks of the first reflection signal and the peaks of the time-shifted second reflection signal.

The device 100 may estimate information indicating a distance to at least one wall of the room or an object in the room by using the earliest peak among the peaks mapped at the same time. The device 100 may estimate the distance information about the room by using the peak time of the earliest peak of the signal and the previously determined speed of the audio signal.

In operation 1230, the device 100 may acquire at least one of angle information about the room.

The angle information about the room may be information indicating an angle with respect to at least one wall of the room or an angle with respect to a corner between walls of the room. The angle information about the room may be information indicating an azimuth.

The user may direct the device 100 toward at least one wall of the room, and the device 100 may acquire angle information about the at least one wall of the room. In addition, the user may direct the device 100 toward at least one corner of the room, and the device 100 may acquire angle information about the at least one corner of the room.

In order to acquire more accurate angle information, the device 100 may use a camera sensor to capture an image of the room toward which the device 100 is directed and may provide the user with a captured image by using a display.

The device 100 may acquire a plurality of pieces of angle information and store the acquired angle information. The device 100 may acquire a plurality of pieces of angle information continuously or substantially continuously.

In operation 1240, the device 100 may generate a floor plan illustrating the structure of the room by using the estimated distance information and the acquired angle information about the room.

The device 100 may generate the floor plan illustrating the structure of the room and display the floor plan. In addition, the device 100 may generate and provide a 3D model representing the structure of the room. The device 100 may print the 3D model by using a 3D printer.

In addition, the device 100 may generate a preview model illustrating the structure of the room by using information about objects in the room. The device 100 may generate a preview model illustrating the structure of the room by adding the information about the objects to the generated floor plan or 3D model.

Figure 13:
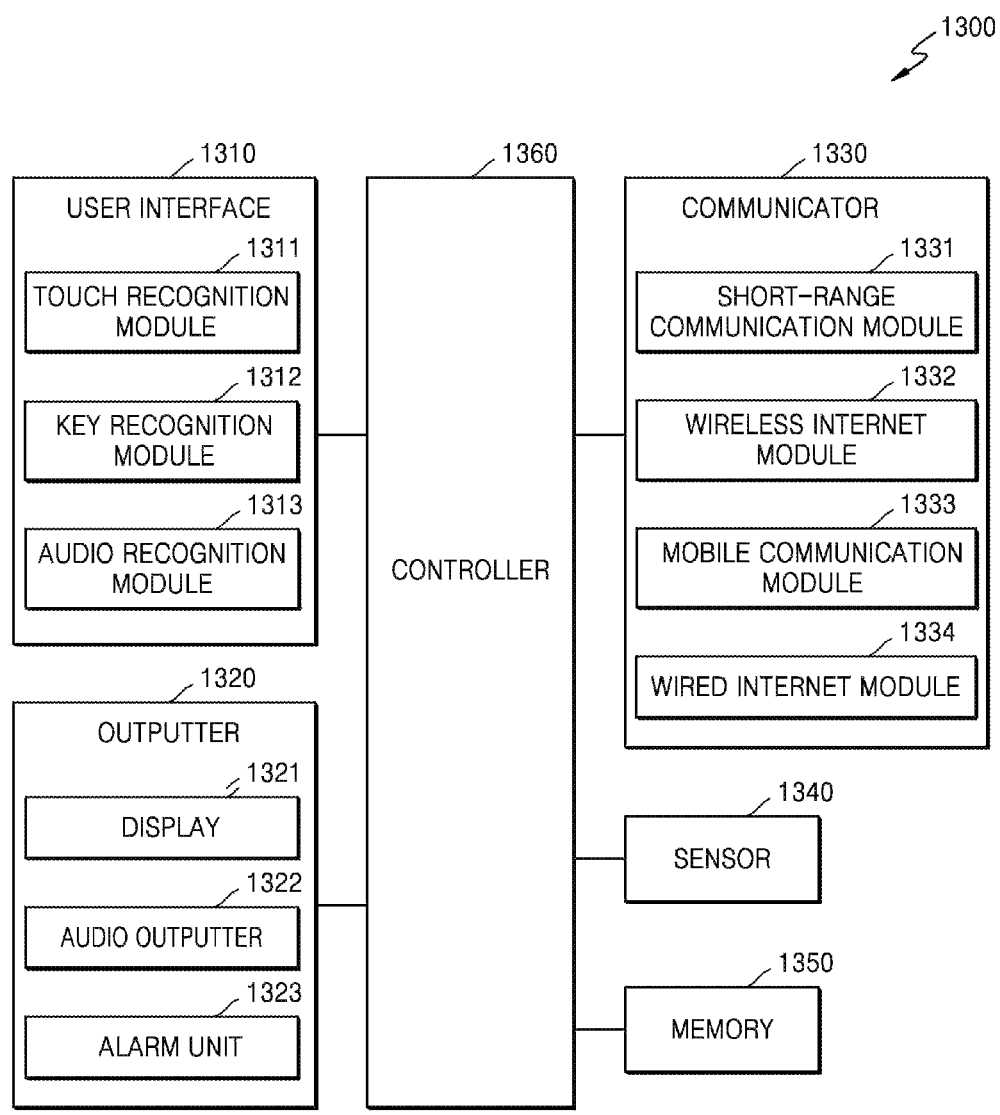
FIG. 13 is a block diagram of a device for generating data representing a structure of a room, according to an exemplary embodiment.

FIG. 13 is a block diagram of a device 1300 for generating data representing a structure of a room, according to an exemplary embodiment.

Referring to FIG. 13, the device 1300 may include a user interface 1310, i.e., a user inputter or a user input unit, an outputter 1320, i.e., a user output unit, a communicator 1330, i.e., a transceiver or a communication unit, a sensor 1340, i.e., a sensing unit, a memory 1350, i.e., a storage, and a controller 1360, i.e., a control unit.

In the device 1300, the user interface 1310 may include a touch recognition module 1311, a key recognition module 1312, and an audio recognition module 1313. The outputter 1320 may include a display 1321, i.e., a display unit, an audio outputter 1322, i.e., an audio output unit or an audio output module, and an alarm 1323, i.e., an alarm unit. The communicator 1330 may include a short-range communication module 1331, a wireless Internet module 1332, a mobile communication module 1333, and a wired Internet module 1334. It will be understood by those skilled in the art that the device 1300 may further include general-purpose hardware components as well as the hardware components illustrated in FIG. 13 or may omit some of the hardware components illustrated in FIG. 13.

The method of generating the data representing the structure of the room, according to the exemplary embodiment, may be performed by the device 1300 of FIG. 13, and the device 100 of FIG. 3 may be included in the device 1300 of FIG. 13.

The device 100 of FIG. 3 may perform all or part of the functions of the device 1300 of FIG. 13. The audio outputter 310 of FIG. 3 may correspond to the audio outputter 1322 of FIG. 13, and the audio receiver 320 of FIG. 3 may correspond to the audio recognition module 1313. The sensor 330 of FIG. 3 may correspond to the sensor 1340 of FIG. 13, and the user interface 340 of FIG. 3 may correspond to the touch recognition module 1311 and the key recognition module 1312 of FIG. 13. The controller 350 of FIG. 3 may correspond to the controller 1360 of FIG. 13.

Hereinafter, components of the device 1300 will be described.

The user interface 1310 may be a hardware component configured to allow the user to input information for controlling the device 1300. For example, the user interface 1310 may include a keypad, a dome switch, a touch pad, a jog wheel, a touch screen, and a jog switch.

The touch recognition module 1311 may detect a touch gesture or a touch input of a user and transmit information about the touch gesture or the touch input to the controller 1360.

The touch recognition module 1311 may include various sensors configured to sense a touch or a hovering. In order to sense the touch gesture or the touch input, the touch recognition module 1311 may include a capacitive overlay type sensor, a resistive overlay type sensor, an infrared beam type sensor, a surface acoustic wave type sensor, an integral strain gauge type sensor, or a piezoelectric type sensor.

The touch recognition module 1311 may sense the hovering by using a proximity sensor. The proximity sensor may sense the presence or absence of an object approaching a detection surface or an object existing near the proximity sensor by using an electromagnetic force or infrared light, without mechanical contact. The detection surface may be a predetermined detection surface. Examples of the proximity sensor includes a transmission-type photoelectric sensor, a direct reflection-type photoelectric sensor, a mirror reflection-type photoelectric sensor, a radio frequency oscillation-type proximity sensor, an electrostatic capacitance type proximity sensor, a magnetic-type proximity sensor, an infrared proximity sensor.

The touch gesture or the touch input of the user may include a tap, a touch and hold, a double-tap, a drag, a flick, a drag and drop, a hovering, or the like.

The touch recognition module 1311 may be a touch screen by formed in a multilayer structure with the display 1321.

The key recognition module 1312 may recognize a user command input via hardware keys (for example, navigation keys, alphabet keys, a mouse, or the like).

The audio recognition module 1313 may be configured to receive an external audio signal and transmit the received audio signal to the controller 1360. The audio recognition module 1313 may be a microphone or an audio input jack.

The outputter 1320 may be a hardware component configured to output an audio signal, a video signal, or an alarm signal.

The display 1321 may be a display interface that displays a variety of information such as information processed in the device 1300 or information to be processed in the device 1300. The display 1321 may display a graphical user interface (GUI) that provides the user with the information processed in the device 1300. The display 1321 may perform functions similar to the display 130 described with reference to FIG. 12. The display may be implemented with a hardware configuration of a touch screen including the touch recognition module 1311 and the display 1321.

The audio outputter 1322 may output audio data that is received via the communicator 1330 or is stored in the memory 1350. The audio outputter 1322 may include a speaker, a buzzer, an audio output jack, or the like.

The alarm 1323 may output a signal for notifying an event occurring in the device 1300. The alarm 1323 may output a signal for notifying an occurrence of an event by using at least one of an audio signal, a video signal, and a vibration signal.

The communicator 1330 may be a hardware component configured to communicate with an external network or an external device.

The short-range communication module 1331 may refer to a module for short-range communication. Short-range communication technologies may include Bluetooth, ultra wideband (UWB), ZigBee, near field communication (NFC), Wi-Fi direct (WFD), infrared data association (IrDA), or the like. The short-range communication module 1331 may include one or more communication chips configured to communicate according to one or more respective short-range communication technologies.

The wireless Internet module 1332 may refer to a module for wireless Internet access. The mobile communication module 1333 may refer to a module for communicating with a mobile communication network. The wired Internet module 1334 may refer to a module for wired Internet access. The wireless Internet module 1332, the mobile communication module 1333, and the wired Internet module 1334 may include one or more chips configured to access various networks.

The sensor 1340 may be a hardware component configured to sense a movement of the device 1300 or an environment around the device 1300. The sensor 1340 may include a terrestrial magnetism sensor, a gyroscope sensor, an acceleration sensor, a gravity sensor, a tilt sensor, and the like. The sensor 1340 may include a camera, an infrared camera, and a proximity sensor.

The memory 1350 may be a hardware component configured to store information processed in the device 1300. The memory 1350 may include a hard disk drive (HDD), a solid state drive (SSD), random access memory (RAM), and read only memory (ROM). The memory 1350 may store information related to a user interface to be displayed on the display 1321.

The controller 1360 may be a hardware configuration that control operations and functions of the device 1300. The controller 1360 may include at least one processor, such as a central processing unit (CPU), and an access point (AP).

As described above, according to the one or more of the above exemplary embodiments, the device for generating the data representing the structure of the room may determine the structure of the room where a user is located and provide the same to the user. Thus, the user may determine the structure of the room and may use a navigation service even in the room. Also, the user may determine the structure of the room anytime and anywhere.

In addition, the device may generate the 3D model or the preview model illustrating the structure of the room and provide the user with the 3D model or the preview model. The user may print the 3D model using s 3D printer. The user may observe the structure of the room without entering the room using the preview model.

The device described herein may include a processor, a memory for storing program data and executing it, a storage such as a disk drive, a communications port for handling communications with external devices, and user interface devices, including a display, keys, etc. When software modules are involved, these software modules may be stored as program instructions or computer readable codes executable on the processor on a computer-readable media such as read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. This media can be read by the computer, stored in the memory, and executed by the processor.

One or more exemplary embodiments may be provided as a non-transitory computer readable medium having stored thereon instructions for performing one or more of the described methods. The non-transitory readable medium may be installed and used in various types of devices. The non-transitory computer-readable medium refers to a medium which does not store data for a short time, such as a register, a cache memory, or the like, but semi-permanently stores data and is readable by a device. Examples of non-transitory computer readable media include a compact disk (CD), a digital versatile disk (DVD), a hard disk, a Blu-ray disk, a universal serial bus (USB) drive, a memory card, a ROM, or the like.

All references, including publications, patent applications, and patents, cited herein are hereby incorporated by reference in their entireties to the same extent as if each reference were individually and specifically indicated to be incorporated by reference and were set forth in its entirety herein.

Reference has been made to certain exemplary embodiments illustrated in the drawings, and specific language has been used to describe these exemplary embodiments. However, no limitation of the scope of the inventive concept is intended by this specific language, and one or more exemplary embodiments should be construed to encompass all exemplary embodiments that would normally occur to one of ordinary skill in the art. Descriptions of features or aspects within each exemplary embodiment should typically be considered as available for other similar features or aspects in other exemplary embodiments.

One or more exemplary embodiments may be described in terms of functional block components and various processing steps. Such functional blocks may be realized by any number of hardware and/or software components configured to perform the specified functions. For example, one or more exemplary embodiments may employ various integrated circuit components, e.g., memory elements, processing elements, logic elements, look-up tables, and the like, which may carry out a variety of functions under the control of one or more microprocessors or other control devices. Similarly, where the elements of the inventive concept are implemented using software programming or software elements the inventive concept may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, one or more exemplary embodiments could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular exemplary embodiments shown and described herein are illustrative examples and are not intended to otherwise limit the scope of the inventive concept in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the term "the" or a similar definite term in the specification (in particular, in the claims) is to be construed to cover both the singular and the plural. In addition, when a range is disclosed in the exemplary embodiments, exemplary embodiments to which individual values belonging to the range are applied may be included (unless otherwise indicated herein), and this is the same as that each of the individual values falling within the range is disclosed in the detailed description of the exemplary embodiments. For steps of the methods, if an order is not clearly disclosed as necessary, the steps may be performed in various orders. The use of all illustrations or illustrative terms (for example, and the like, etc.) are simply used to describe certain aspects of one or more exemplary embodiments, and the scope of the inventive concept is not limited due to the illustrations or illustrative terms. In addition, it will be understood by those of ordinary skill in the art that various modifications, combinations, and changes may be made according to design conditions and factors within the scope of the attached claims or the equivalents.

It should be understood that certain exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A method of generating data representing a structure of a room on a device, the method comprising:
    outputting an audio signal at a first position in the room;
    acquiring a first reflection signal of the audio signal that is output at the first position;
    outputting the audio signal at a second position in the room;
    acquiring a second reflection signal of the audio signal that is output at the second position;
    estimating distance information about the room by using the acquired first and second reflection signals;
    acquiring angle information about the room; and
    generating a floor plan illustrating the structure of the room using the estimated distance information and the acquired angle information,
    wherein the estimating the distance information comprises:
        mapping the first reflection signal and the second reflection signal based on a distance between the first position and the second position; and
        estimating the distance information about the room based on the mapped first and second reflection signals.

2. The method of claim 1, further comprising generating a three-dimensional (3D) model illustrating the structure of the room based on the generated floor plan.

3. The method of claim 1, further comprising generating a three-dimensional (3D) model illustrating the structure of the room based on the generated floor plan and information about objects in the room.

4. The method of claim 1, wherein the distance information about the room indicates a distance between the device and at least one of a wall of the room and an object in the room.

5. The method of claim 1, wherein the estimating comprises estimating the distance information based on a distance between the first position and the second position.

6. The method of claim 1, further comprising:
    acquiring an image of the room; and
    displaying at least one auxiliary line on the image of the room, wherein a corner of the room and a wall of the room are obtained based on the image of the room and the at least one auxiliary line.

7. The method of claim 1, wherein mapping comprises mapping the first reflection signal and the second reflection signal based on a time for the audio signal to travel the distance between the first position and the second position.

8. The method of claim 1, wherein
the first reflection signal and the second reflection signal are reflected from at least one of a wall of the room and an object in the room, and
the estimating comprises estimating information about a distance between the device and the at least one of the wall of the room and the object in the room.

9. The method of claim 1, wherein the acquiring of the angle information comprises acquiring at least one of an angle with respect to at least one wall of the room and an angle with respect to a corner between walls of the room.

10. The method of claim 1, wherein the acquiring of the angle information comprises:
acquiring angle information about the room based on a user input with respect to at least one of a wall of the room and a corner of the room; and
storing the acquired angle information.

11. A non-transitory computer-readable recording medium having embedded thereon a program for executing the method of claim 1.

12. A device comprising:
an audio outputter;
an audio receiver;
a sensor configured to acquire angle information about a room; and
a controller configured to:
control the audio outputter to output an audio signal at a first position in the room,
control the audio receiver to receive a first reflection signal of the audio signal at the first position,
control the audio outputter to output the audio signal at a second position in the room,
control the audio receiver to receive a second reflection signal of the audio signal at the second position,
estimate distance information about the room using the received first and second reflection signals, and
generate a floor plan illustrating a structure of the room using the estimated distance information and the acquired angle information,
wherein the estimating the distance information comprises:
mapping the first reflection signal and the second reflection signal based on a distance between the first position and the second position; and
estimating the distance information about the room based on the mapped first and second reflection signals.

13. The device of claim 12, wherein the controller is further configured to generate a three-dimensional (3D) model illustrating the structure of the room based on the floor plan.

14. The device of claim 12, wherein the controller is further configured to generate a three-dimensional (3D) model illustrating the structure of the room based on the floor plan and information about objects in the room.

15. The device of claim 12, wherein the distance information indicates a distance between the device and at least one of a wall of the room and an object in the room.

16. The device of claim 12, wherein the controller is further configured to estimate the distance information based on a distance between the first position and the second position.

17. The device of claim 12, further comprising a display,
wherein the sensor is further configured to acquire an image of the room,
wherein the controller is further configured to control the display to display the image of the room and at least one auxiliary line on the image of the room, and
wherein a corner of the room and a wall of the room are obtained based on the image of the room and the at least one auxiliary line.

18. The device of claim 12, wherein the controller is further configured to map the first reflection signal and the second reflection signal based on a time for the audio signal to travel the distance between the first position and the second position.

19. The device of claim 12, further comprising a user interface configured to acquire the first reflection signal and the second reflection signal that are reflected from at least one of a wall of the room and an object in the room,
wherein the controller is further configured to estimate information about a distance between the device and the at least one of the wall of the room and the object in the room.

20. The device of claim 12, wherein the sensor is further configured to acquire at least one of an angle with respect to a wall of the room and an angle with respect to a corner between walls of the room.

21. The device of claim 12, further comprising a user interface configured to receive a user input,
wherein controller is further configured to control the sensor to acquire the angle information about the room in response to the received user input.

22. A device comprising:
a speaker;
a microphone;
an audio receiver;
a sensor configured to acquire angle information about a room; and
a controller configured to:
control the speaker to output an audio signal from a first position in the room,
control the microphone to receive a first reflection signal of the audio signal that is output from the first position,
control the speaker to output the audio signal from a second position in the room,
control the audio receiver to receive a second reflection signal of the audio signal that is output from the second position,
estimate distance information about the room using the received first reflection signal and the received second reflection signal,
control the sensor to acquire the angle information, and
generate room structure information of the room based on the estimated distance information and the acquired angle information,
wherein the estimating the distance information comprises:
mapping the first reflection signal and the second reflection signal based on a distance between the first position and the second position; and
estimating the distance information about the room based on the mapped first and second reflection signals.

23. The device of claim 22, wherein
the sensor comprises a camera, and
the controller is further configured to:
   control the camera to capture an image of at least one of a wall of the room and a corner of the room, and
   estimate the angle information based on the captured image.

24. The device of claim 22, wherein
the sensor comprises a camera, and
the controller is further configured to:
   control the camera to capture an image of at least one of a wall of the room and a corner of the room from at least one of the first position and the second position, and
   estimate the angle information based on the captured image.

25. The device of claim 22, wherein the controller is further configured to:
   extract a plurality of peaks from the first reflection signal,
   extract a plurality of peaks from the second reflection signal,
   map the plurality of peaks of the second reflection signal to the plurality of peaks of the first reflection signal based on a distance between the first position and the second position, and
   estimate the distance information using the mapped plurality of peaks.

* * * * *